United States Patent [19]
Mizuno et al.

[11] Patent Number: 5,405,810
[45] Date of Patent: Apr. 11, 1995

[54] ALIGNMENT METHOD AND APPARATUS

[75] Inventors: Fumio Mizuno, Tokorozawa; Noboru Moriuchi, Ohme; Seiichiro Shirai, Hamura, all of Japan

[73] Assignee: Hitachi, Ltd., Tokyo, Japan

[21] Appl. No.: 869,174

[22] Filed: Apr. 16, 1992

[30] Foreign Application Priority Data

Apr. 19, 1991 [JP] Japan .................................. 3-088052
Jul. 17, 1991 [JP] Japan .................................. 3-176492

[51] Int. Cl.$^6$ ........................................... H01L 21/312
[52] U.S. Cl. .................................... 437/229; 437/924
[58] Field of Search ............... 437/225, 228, 229, 924;
356/401; 250/492.1; 430/22

[56] References Cited

U.S. PATENT DOCUMENTS

| | | | |
|---|---|---|---|
| 4,377,028 | 3/1983 | Imahashi | 437/924 |
| 4,414,749 | 11/1983 | Johannsmeier | 437/924 |
| 4,936,930 | 6/1990 | Gruber et al. | 437/924 |

FOREIGN PATENT DOCUMENTS

| | | | |
|---|---|---|---|
| 0209125 | 8/1988 | Japan | 437/924 |
| 0291431 | 11/1988 | Japan | 437/924 |

*Primary Examiner*—Tom Thomas
*Attorney, Agent, or Firm*—Antonelli, Terry, Stout & Kraus

[57] ABSTRACT

The present invention enables the accuracy of aligning a wafer and a reticle with each other in the exposure step in the manufacture of a semiconductor integrated circuit device to be improved. The portions of a metal film 5 and a resist film 6 which cover an alignment mark 4 on a wafer 1 are removed by a gas assisted etching treatment using a laser beam prior to the execution of an exposure treatment, so as to bare the alignment mark 4. The position detecting light is then applied from an alignment mark position detecting means in a reduction projection exposure unit 11 to the alignment mark 4, the position of the alignment mark 4 being detected on the basis of the light reflected on and scattered from the alignment mark 4.

31 Claims, 14 Drawing Sheets

ALIGNMENT METHOD AND APPARATUS

Background of the Invention

This invention relates to the techniques for alignment method and apparatus, and more particularly to the techniques effectively applied to an alignment method carried out in a step of manufacturing, for example, semiconductor integrated circuit devices, and an alignment apparatus for practicing the same method.

A general alignment method used in a reduction projection exposure step constituting a step of manufacturing semiconductor integrated circuit devices will now be described as an example of a conventional alignment method with reference to FIGS. 25-30.

A cross section of a principal portion of a semiconductor wafer (which will hereinafter be referred to simply as a wafer) placed on a stage in a reduction projection exposure apparatus is shown in FIG. 25.

A projecting alignment mark (which will hereinafter be referred to simply as a mark) 52 consisting, for example, of silicon dioxide ($SiO_2$) is formed on the upper surface of the wafer 51 placed on a stage 50.

The alignment mark 52 is a target mark for use in detecting the position of the wafer 51 when the wafer 51 and a reticle 53 provided above the wafer 51 are relatively aligned.

Besides a projecting alignment mark 52, a recessed alignment mark is used in some cases. A projecting alignment mark and a recessed alignment mark are formed at once on one wafer 51 in some cases. Besides silicon dioxide, polysilicon may be used as a material for the alignment mark 52, and such a material is determined selectively in accordance with the manufacturing step.

The alignment mark 52 is covered with, for example, a wiring metal film 54 formed on the wafer 51. A photoresist (which will hereinafter be referred to simply as a resist) film 55 is formed on the metal film 54.

In a step of manufacturing semiconductor integrated circuit devices, it is necessary that more than ten layers of semiconductor integrated circuit patterns (which will hereinafter be referred to as circuit patterns) be laminated accurately. The reasons reside in that the dislocation of circuit patterns causes a decrease in the reliability and yield of the products.

Therefore, it is necessary in a reduction exposure apparatus (not shown) to carry out an exposure operation after the relative positions of the wafer 51 and reticle 53 have been secured.

According to the conventional techniques, the relative positions of the wafer 51 and reticle 53 are set, for example, in the following manner prior to an exposure operation.

First, as shown in FIG. 26, a region including the alignment mark 52 is scanned with a laser beam 56, and the scattered light reflected on the same region is detected to obtain a detected waveform 57 shown in FIG. 27. The two needle-like waveform portions 57a, 57a of the detected waveform 57 of FIG. 27 are obtained correspondingly to the stepped portions at both ends of the alignment mark 52.

The laser beam 56 used as alignment light consists generally of a laser beam the wavelength of which is larger than that of exposure light, i.e. a low-energy laser beam so as not to expose the resist film 55 to light during the detection of the alignment mark 52.

For example, when the i-rays (having a wavelength of 365 nm) of a mercury lamp are used as exposure light, a He-Ne laser beam (having a wavelength of 633 nm) is used as alignment light.

In the reduction exposure apparatus, the data on the detected waveform are then transmitted to a calculator (not shown). In the calculator, the coordinates of the center C (shown by a broken line in FIG. 27) of the alignment mark 52 are calculated on the basis of the data on the two needle-like portions 57a, 57a of the detected waveform, and the coordinates thus obtained are determined as the coordinates of the position of the alignment mark 52.

The reduction exposure apparatus is then so operated as to finely move the stage 50 of FIG. 25 on the basis of the coordinates of the position of the alignment mark 52 and set the relative positions of the wafer 51 and reticle 53 in alignment with each other.

After such an alignment operation has been completed, the product is subjected to exposure as shown in FIG. 28, to transfer the patterns 53a on the reticle 53 to the resist film 55.

The resultant product is subjected to development to form resist patterns 58 on the wafer 51 as shown in FIG. 29.

The bared portions of the wiring metal film 54 are then removed by etching with the resist patterns 58 used as masks, and the resist patterns 58 are thereafter taken off to form wiring patterns 59 on the wafer 51 as shown in FIG. 30.

The alignment techniques in an exposure step for the production of such a semiconductor integrated circuit device are disclosed in, for example, Japanese Patent Laid-Open Nos. 262427/1987, 102314/1988, 117421/1988, 298017/1990, 62318/1988, 27013/1988 and 171226/1989.

First, Japanese Patent Laid-Open Nos. 262427/1987, 102314/1988, 117421/1988 and 298017/1990 disclose the techniques for preventing a decrease in the accuracy of detecting the position of an alignment mark, which is ascribed to troubles concerning the resist film and will be described later, by gasifying, melting and removing the alignment mark-covering portion of the resist film with a laser beam prior to the execution of the step of detecting the position of the alignment mark.

According to these conventional techniques, the detection of the position of the alignment mark is carried out without removing the films to be processed, such as the alignment mark-covering insulating film and metal film. Namely, when the step of detecting the position of the alignment mark is carried out, the surface of the alignment mark is covered with the film to be processed, such as an insulating film or a metal film.

Secondly, Japanese Patent Laid-Open No. 62318/1988 discloses the techniques for preventing a decrease in the accuracy of detecting the position of an alignment mark, which is ascribed to troubles concerning the resist film, by exposing the alignment mark-covering portion of a resist film to light prior to the execution of the step of detecting the position of the alignment mark, and removing this portion of the resist film with a developing agent.

According to these conventional techniques, the detection of the position of the alignment mark is also carried out without removing the films to be processed, such as the alignment mark-covering insulating film and metal film. Namely, when the step of detecting the position of the alignment mark is carried out, the surface of the alignment mark is covered in this case as well with the film to be processed, such as an insulating film or a metal film.

Thirdly, Japanese Patent Laid-Open No. 27013/1988 discloses the techniques for preventing a decrease in the accuracy of detecting the position of an alignment mark, which is ascribed to troubles concerning the insulating film, by removing the portion of the insulating film, a film to be processed, which covers an alignment film by etching prior to the execution of the step of detecting the position of the alignment mark.

According to these conventional techniques, a resist film to which a circuit pattern is to be transferred is formed on the wafer after the alignment mark-covering portion of the insulating film has been removed. Therefore, when the step of detecting the alignment mark is carried out, the surface of the alignment mark is covered with the resist film.

Fourthly, Japanese Patent Laid-Open No. 171226/1990 discloses the techniques for preventing a decrease in the accuracy of detecting the position of an alignment mark, which occurs when the stepped portions of the slignment mark which has been formed on the upper surface of an insulating film are removed due to the flattening of the insulating film constituting a film to be processed formed on the wafer.

The process according to these conventional techniques is carried out as follows. First, a resist film is formed on the insulating film to be flattened, in such a manner that the upper surface of the resist film becomes flat.

Only the portion of the resist film that correspond to the region of the alignment mark is removed to form an opening.

The resist film and the portion of the insulating film which is bared in the opening of the resist film are then subjected to RIE (Reactive Ion Etching) at the same speed to remove the same.

The upper surface of the insulating film is flattened, and the portion thereof which is bared in the opening and corresponds to the region of the alignment mark is removed to expose the alignment mark.

According to these conventional techniques, the resist film to which a circuit pattern is to be transferred is also formed on the wafer when the flattened insulating film is processed. Therefore, when the step of detecting the position of the alignment mark is carried out, the surface of the alignment is covered with a resist film.

SUMMARY OF THE INVENTION

In, for example, a semiconductor integrated circuit device, the size of a circuit pattern tends to decrease increasingly in recent years.

Accordingly, a very high alignment accuracy with respect to the position in which a circuit pattern is to be formed has been demanded.

The reasons why a high alignment accuracy is required reside in that, if a circuit pattern is miniaturized, even the slight dislocation of the circuit pattern causes the electric property of an element to be deteriorated, and the yield and reliability of a product to decrease.

Therefore, how to improve the accuracy of aligning a wafer and a reticle with each other prior to an exposure operation in the techniques for manufacturing semiconductor integrated circuit devices has become an important problem.

According to general alignment techniques in the above-mentioned reduction exposure step, the accuracy of detecting an alignment mark lowers due to the asymmetry of a film to be processed which covers the alignment mark and the uneven formation of a resist film, so that the alignment accuracy decreases. This phenomenon will be described with reference to FIG. 31.

FIG. 31 is an enlarged cross section of the metal film 54 and resist film 55 on the alignment mark 52 shown in FIG. 25.

As shown in FIG. 31, the metal film 54 on the alignment mark 52 is not always so formed that the cross-sectional shape of the metal film 54 corresponds perfectly to the stepped cross-sectional shape of the alignment mark 52. The metal mark 54 is formed asymmetrically in section at the left and right ends thereof.

The upper surface of the resist film 55 does not always become flat; the upper surface of the resist film 55 in this drawing has a projecting portion 55a due to the uneven formation of the same film.

Such asymmetry of the metal film 54 causes a difference to occur between the detected coordinates of the center of the alignment mark and the actual coordinates thereof. The unevenness of the formation of the resist film 55 causes distortion to occur in the detected waveform 57 shown in FIG. 27, and noise in the corresponding signal. These troubles cause a decrease in the accuracy of relatively aligning the wafer 51 and reticle with each other.

Such a decrease in the alignment accuracy due to the asymmetry of a film to be processed, such as the metal film 54 covering the alignment mark 52 and the unevenness of the formation of the resist film 55 occurs more or less not only in the case where the light having a single wavelength is used as alignment light but also in the case where an optical beam of a plurality of wavelengths, which is used generally for alleviating the influence of the unevenness of the formation of the resist film, (for example, an optical beam in which the wavelengths of the e-rays and d-rays from a mercury lamp are mixed), a wide-band optical beam having a band width of, for example, 50–100 nm, or white light is used as alignment light.

The same problems arise when a beam, such as an electron beam or an ion beam, which is other than light, is used for an alignment operation.

According to the conventional techniques disclosed in the first publication above, the portion of the resist film which is on the alignment mark is removed. Accordingly, it is possible to prevent a decrease, which is ascribable to the condition of formation of the resist film, of the alignment accuracy.

However, these conventional techniques have a problem that a decrease in the accuracy, which is ascribable to the condition of formation of the film to be processed, such as the insulating film or metal film covering the alignment mark, of detecting the position of the alignment mark. Especially, when the film to be processed which covers the alignment mark consists of a material which is opaque with respect to the alignment light, such as the material of the metal film as mentioned above, the asymmetry of such a film becomes an important problem.

According to these conventional techniques, the resist film 55 is removed by gasification-melting the same with a laser beam 60 as shown in, for example, FIG. 32, so that the metal film 54 under the resist film 55 is damaged, i.e., the bared surface of the metal film 54 is coarsened. Consequently, the distortion of a detected waveform and noise in a detected signal increase to cause the S/N ratio of the detected signal and the accuracy of detecting the position of the alignment mark 52 to lower.

Moreover, when the resist film is gasification-melted according to these conventional techniques, fine particles of the molten resist scatter to cause the pattern to become defective.

According to the conventional techniques disclosed in the second publication, the portion of the resist film which is on the alignment mark is removed. Accordingly, it is possible to avoid a decrease, which is ascribable to the condition of formation of the resist film, in the accuracy of detecting the position of the alignment mark but a decrease, which is ascribable to the condition of formation of a film to be processed, such as the insulating film or metal film covering the alignment mark, in the accuracy of detecting the position of the alignment mark cannot be avoided.

According to the techniques disclosed in the third and fourth publications referred to above, the portion of the insulating film which covers the alignment mark is removed. Accordingly, it is possible to avoid a decrease, which is ascribable to the asymmetry and unevenness of thickness of the same portion of the insulating film, in the accuracy of detecting the position of the alignment mark but consideration is not given to a case where a metal film is formed on the alignment mark. Consequently, a problem of the asymmetry of an opaque film to be processed, such as a metal film remains.

According to these techniques, the surface of the alignment mark is covered with the resist film when a step of detecting the position of the alignment mark is carried out, so that a problem of a decrease, which is ascribable to the unevenness of formation the resist film, in the accuracy of detecting the position of the alignment film also arises.

The present invention has been developed with attention paid to these problems, and an object of the same invention is to provide techniques capable of improving the substrate aligning accuracy.

Another object of the present invention is to provide techniques capable of improving the yield and reliability of a semiconductor integrated circuit device by improving the accuracy of a position in which a circuit pattern of the semiconductor integrated circuit device is formed.

The above and other objects as well as novel characteristics of the present invention will become clear from the description in the specification and accompanying drawings.

The outlines of the typical inventions out of the inventions disclosed in this application will be briefly described as follows.

The invention defined in claim 1 is an alignment method wherein the coordinates of one alignment mark or a predetermined alignment mark out of not less than two alignment marks formed on a substrate are detected, the setting of the position of a substrate being done on the basis of the position coordinates, characterized in that the method has a step of removing a predetermined portion of a film covering the predetermined alignment mark, before the step of detecting the position of the same alignment mark has been carried out, so as to bare the same alignment mark.

The invention defined in claim 2 is an alignment method characterized in that a predetermined portion of a film covering a predetermined alignment mark is removed by gas-assisted etching using an energy beam.

According to the invention defined in claim 1 mentioned above, a decrease, which is ascribable to the condition of an alignment mark-covering film, in the accuracy of detecting the position of the alignment mark can be prevented.

Namely, since the accuracy of detecting the position of the alignment mark can be improved, the accuracy of aligning the substrate can be improved.

According to the invention defined in claim 2 mentioned above, the film covering the alignment mark can be selectively removed.

This invention enables the alignment mark-covering film to be removed without damaging the surface of the alignment mark.

Therefore, an excellent detected signal having little noise can be obtained from the alignment mark in an operation for detecting the position of the alignment mark.

DESCRIPTION OF THE PREFERRED EMBODIMENTS

Figure 1:
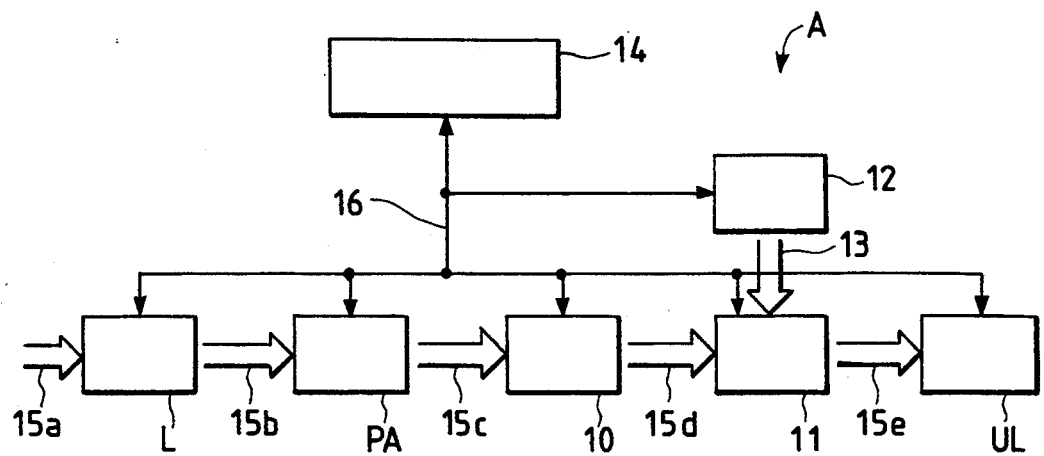
FIG. 1 illustrates the construction of an embodiment of the alignment apparatus according to the present invention.
Figure 2:
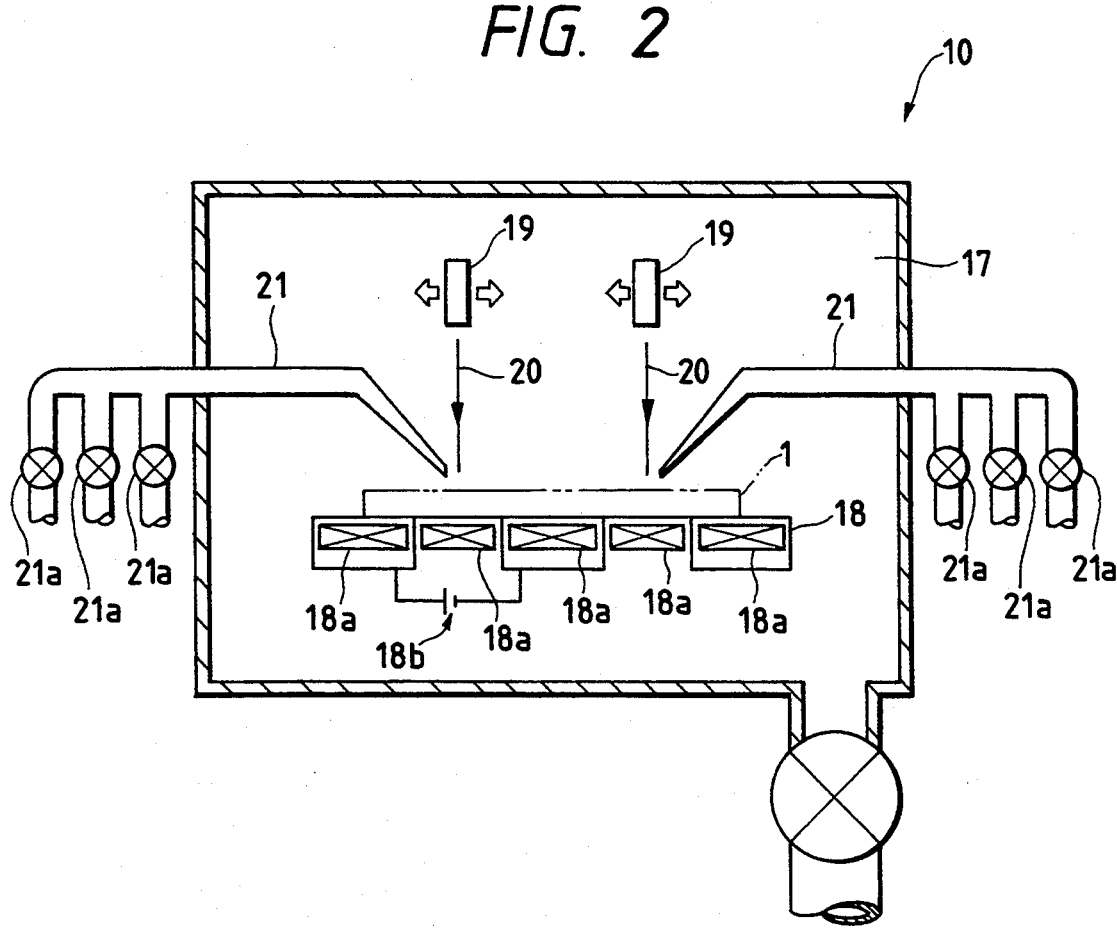
FIG. 2 illustrates an alignment mark baring means in the alignment apparatus.
Figure 3:
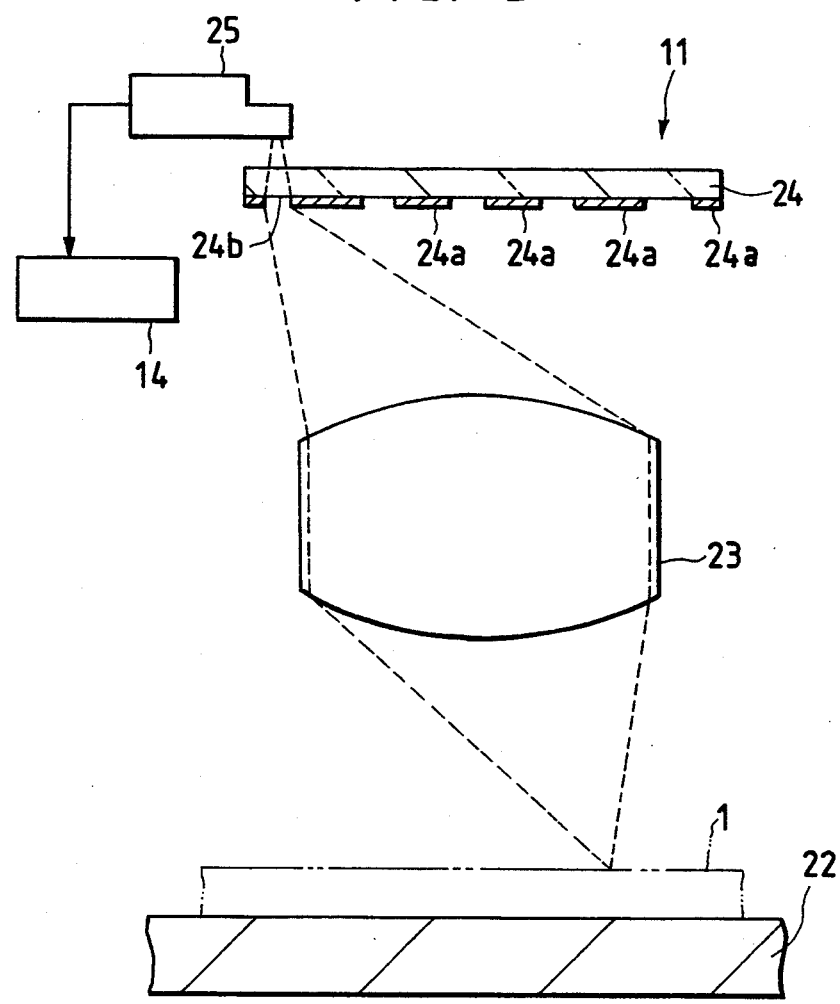
FIG. 3 illustrates an alignment means in the alignment apparatus.
Figure 4:
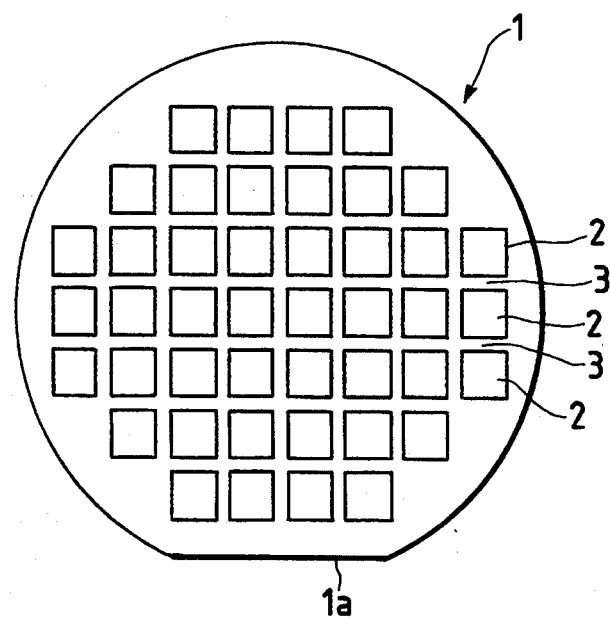
FIG. 4 is a general view of a substrate constituting an object of an alignment operation in the embodiment.

FIG. 1 illustrates the construction of an embodiment of the alignment apparatus according to the present invention, FIG. 2 an alignment mark exposing means in this alignment apparatus, and FIG. 3 an alignment means in the same alignment apparatus. FIG. 4 is a general view of a substrate constituting an object of an alignment operation in this embodiment, FIG. 5 a cross-sectional view of a principal portion of the substrate of FIG. 4, FIGS. 6–8 general plan views showing examples of the shapes in plan of alignment marks, FIG. 9 a plan view showing an example of arrangement of alignment marks, FIGS. 10–13 enlarged sectional views of examples of alignment marks, FIGS. 14–16 sectional views of a principal portion of a substrate in an alignment mark baring step, FIG. 17 a sectional view of a principal portion of a substrate in an alignment step, and FIGS. 18–21 enlarged sectional views of the alignment marks of FIGS. 10–13 which have finished being subjected to the mark exposing steps.

First, before describing the embodiment of the alignment apparatus, a substrate, an object of an alignment operation will be described with reference to FIGS. 4–13.

FIGS. 4–13 show the condition of a substrate in the first half of an alignment mark baring step which will be described later.

The substrate, an object of an alignment operation in this embodiment is, for example a wafer (substrate) 1 shown in FIG. 4. The wafer 1 consists, for example, of monocrystal of silicon (Si), and has an orientation flat 1a at one portion thereof.

A plurality of square regions on the main surface of the wafer 1 indicate semiconductor chip regions 2. The semiconductor chip regions 2 are the regions on which predetermined semiconductor integrated circuit devices, for example, logic circuits or memory circuits are to be formed.

The regions between adjacent semiconductor chip regions 2 indicate scribing regions 3. The scribing regions 3 are cutting regions used when the semiconductor chip regions 2 are cut off from the wafer 1.

Figure 5:
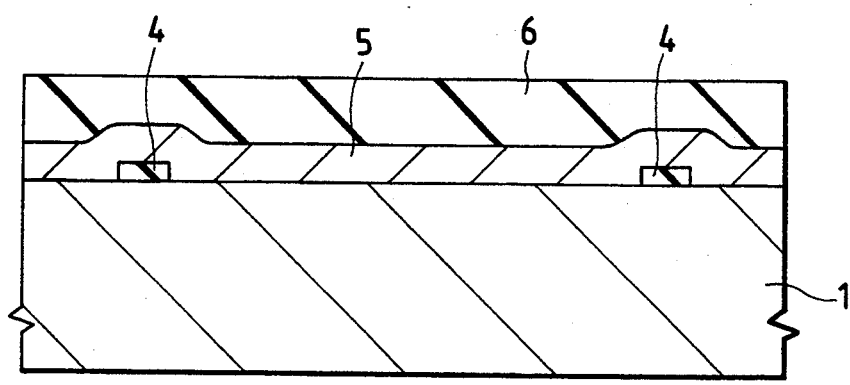
FIG. 5 is a cross-sectional view of a principal portion of the substrate of FIG. 4.

A scribing region 3 is provided therein with, for example, a cross-sectionally projecting alignment mark 4 as shown in FIG. 5. FIG. 5 shows alignment marks 4 formed on a plurality of portions of the upper surface of the wafer 1.

The alignment marks 4 are covered with, for example, a wiring metal film (predetermined film) 5 constituting a film to be processed and formed on the wafer, and a resist film (predetermined film) 6 formed on the metal film 5. The wiring metal film 5 consists, for example, of aluminum (Al) or an aluminum alloy.

In this embodiment, the alignment mark 4 consists, for example, of $SiO_2$, and the shape in plan thereof is, for example, square. The size in plan of the mark 4 in this embodiment is, for example, around 4×4 μm.

Figure 6:
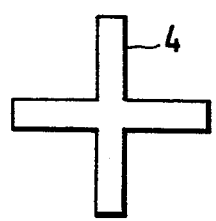
FIG. 6 is a general plan view of an example of the alignment mark in the present invention.
Figure 7:
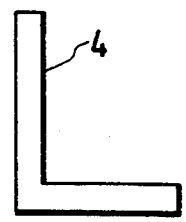
FIG. 7 is a general plan view of another example of the alignment mark in the present invention.
Figure 8:
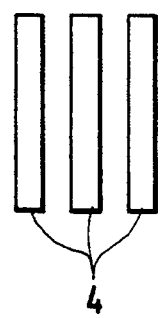
FIG. 8 is a general plan view of further example of the alignment mark in the present invention.

The shape in plan of the alignment mark 4 is not limited to a square shape; it can be changed variously. It may be, for example, cruciform as shown in FIG. 6, L-shaped as shown in FIG. 7, and rectangular as shown in FIG. 8.

Figure 9:
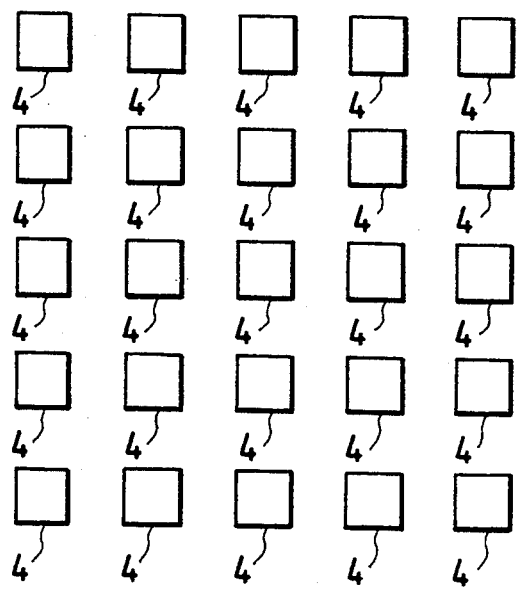
FIG. 9 is a plan view showing another example of arrangement of the alignment marks in the present invention.

Only one alignment mark 4 may be provided in one alignment mark region, and also a plurality of alignment marks 4 as shown in FIG. 9. The size in plan of the alignment mark is, for example, around 4×4 μm, and the distance between adjacent alignment marks 4, 4 is, for example, around 8 μm.

The cross-sectional shape of the alignment mark 4 is not limited to a projecting shape; it may have, for example, a recessed shape. The material for the alignment mark may also be changed variously depending upon the manufacturing step. Some examples of the alignment mark are shown in FIG. 10–13. These drawings show examples of alignment marks 4 having a recessed cross-sectional shape.

Figure 10:
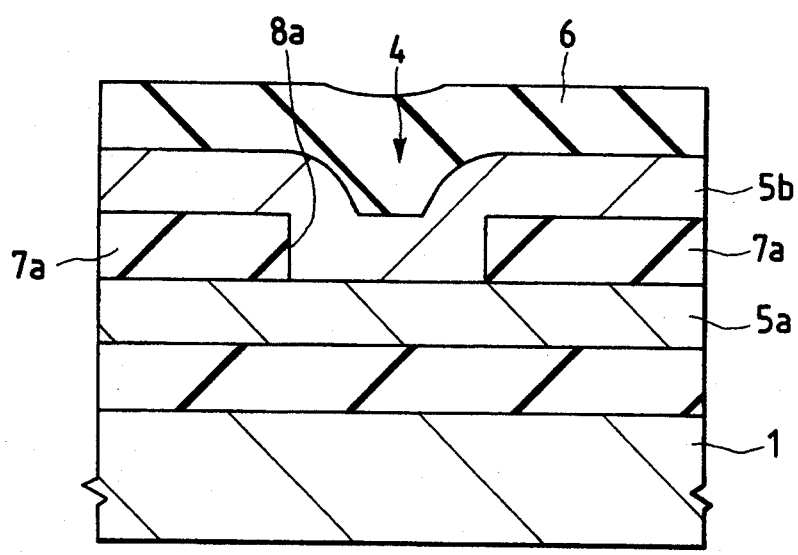
FIG. 10 is an enlarged sectional view of another example of the alignment mark in the present invention.

FIG. 10 shows a cross-sectionally recessed alignment mark 4 formed with a bore 8a made in an insulating film 7a on a metal film 5a. This insulating film 7a consists, for example, of $SiO_2$.

The alignment mark 4 in this case is covered with a metal film (predetermined film) 5b, a film to be processed formed on the insulating film 7a. Namely, the alignment mark 4 is covered with a film which is not permeable with respect to the alignment light. The upper surface of the metal film 5b is coated with a resist film 6.

Figure 11:
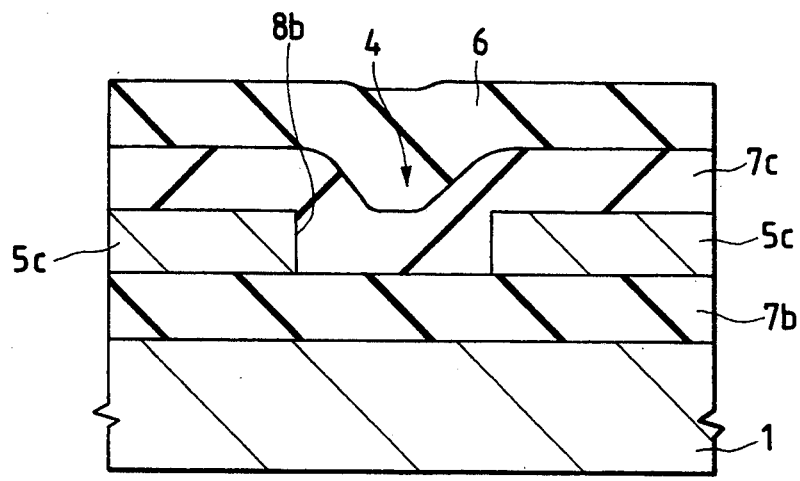
FIG. 11 is an enlarged sectional view of still another example of the alignment mark in the present invention.

FIG. 11 shows a case where a cross-sectionally recessed alignment mark 4 formed with a bore 8b made in a metal film 5c on an insulating film 7b is provided.

The alignment mark 4 in this case is covered with an insulating film (predetermined film) 7c, a film to be processed formed on a metal film 5c. The upper surface of the insulating film 7c is coated with a resist film 6. The insulating films 7b, 7c also consist, for example, of $SiO_2$.

Figure 12:
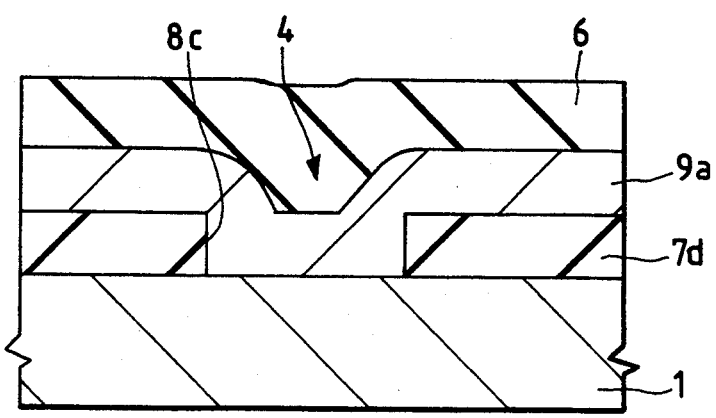
FIG. 12 is an enlarged sectional view of a further example of the alignment mark in the present invention.

FIG. 12 shows a case where a cross-sectionally recessed alignment mark 4 is formed with a bore 8c made in an insulating film 7d on a wafer 1.

The alignment mark 4 in this case is covered with a conductive film (predetermined mark) 9a, a film to be processed formed on the insulating film 7d. The conductive film 9a consists, for example, of doped polysilicon. Namely, the alignment mark 4 is covered with a film not permeable with respect to the alignment light. The upper surface of the conductive film 9a is coated with a resist film 6.

The insulating film 7d consists, for example, of $SiO_2$.

Figure 13:
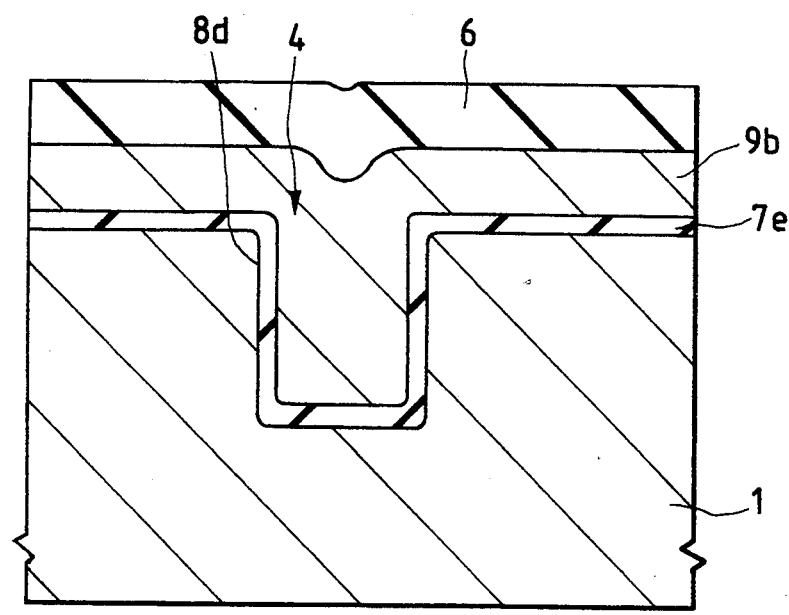
FIG. 13 is an enlarged sectional view of another example of the alignment mark in the present invention.

FIG. 13 shows a case where a cross-sectionally recessed alignment mark 4 is formed with a bore 8d made in a wafer 1.

The alignment mark 4 in this case is covered with an insulating film (predetermined film) 7e formed on the upper surface of the wafer 1 and a conductive film (predetermined film) 9b, a film to be processed formed on the insulating film 7e. The conductive film 9b also consists, for example, of doped polysilicon, the upper surface of which is coated with a resist film 6. The insulating film 7e consists, for example, of $SiO_2$.

The alignment apparatus of this embodiment will now be described with reference to FIGS. 1-5.

The alignment apparatus A of this embodiment shown in FIG. 1 has a loader L, a prealignment unit PA, an alignment mark baring unit (alignment mark baring means) 10, a reduction projection exposure unit (alignment means) 11, a reticle storage case 12, a reticle transfer system 13, an unloader UL, a main control unit 14 and wafer transfer systems 15a–15e.

The main control unit 14 and the other constituent parts, i.e. the loader L, prealignment unit PA, alignment mark baring unit 10, reduction projection exposure unit 11, unloader UL, reticle storage case 12, reticle transfer system 13 and wafer transfer systems 15a–15e are connected electrically by a control signal line 16.

The loader L is a mechanism for carrying a wafer 1 into the alignment apparatus A. The loader L is adapted to be loaded with a wafer cassette (not shown).

The wafer cassette contains a plurality of pieces of wafers 1 for one work lot. The wafer cassette shows on a portion thereof the name of lot with, for example, a bar code. The name of lot is read by a bar code reader (not shown) in the loader L, and converted into an electric signal, which is then transferred to the main control unit 14.

The main control unit 14 is adapted to draw out a file, in which the work instructions corresponding to the name of lot are recorded, from a memory (not shown) therein, and automatically carry out the subsequent processing of the wafer on the basis of the work instructions.

The wafers 1 in the wafer cassette is sent sheet by sheet to the wafer transfer system 15b and processed in order.

The prealignment unit PA is a mechanism for detecting the position of the alignment mark 4 on the wafer 1 with not so high an accuracy. The prealignment unit PA is adapted to detect the position of the alignment mark 4 on the basis of the position of, for example, the orientation flat 1a of the wafer 1.

The alignment mark baring unit 10 is a mechanism for removing the portions of the metal film 5 and resist film 6 on the wafer 1 which cover the alignment mark 4.

The alignment mark baring unit 10 has a mechanism for removing the portion of a film which covers the alignment mark 4 by the gas-assisted etching using an energy beam as will be described later.

The alignment mark baring unit 10 in this embodiment is shown in FIG. 2. A treatment chamber 17 in the alignment mark baring unit 10 is set vacuous before a mark-carrying wafer has been treated therein.

A stage 18 provided in the treatment chamber 17 is set movable, for example, in X- and Y-directions, i.e., in two-dimensional directions.

The stage 18 is provided therein with heating means 18a, such as, for example, heaters. The purpose of providing these heating means 18a is to promote an etching reaction by heating the wafer 1 during an alignment mark baring treatment, and reduce the treatment time.

The stage 18 is so formed that the wafer 1 is placed thereon in a fixed state by an electrostatic chucking method. A power source 18b represents an adsorption power source.

Beam irradiation means 19 are provided above the stage 18. The beam irradiation means 19 are means for irradiating the wafer 1 with an energy beam for exciting an etching gas and rendering it radical before an alignment mark baring treatment, which will be described later, has been started.

Each of the beam irradiation means 19 in this embodiment is formed so that, for example, a laser beam 20 can be emitted as an energy beam. The energy beam is not limited to a laser beam; it may be changed to various types of beams, for example, an electron beam and an ion beam.

In this embodiment, a plurality of beam irradiation means 19 are provided. The purpose of providing a plurality of beam irradiation means is to enable the laser beams 20 to be applied simultaneously to the alignment marks 4 in different positions on the wafer 1, and the portions of a film which cover the alignment marks in different positions to be removed at once, and reduce the treatment time.

Each beam irradiation means 19 is so formed that it can be moved in the X-, Y- and Z-directions, i.e., in the three-dimensional directions. The purpose of forming the beam irradiation means 19 in this manner is to enable the laser beam 20 to be applied to the alignment mark 4 in any position on the wafer 1.

The alignment mark baring unit 10 has a gas nozzle (gas supply nozzle) 21 for supplying an etching gas to a position to which a laser beam is applied.

In this embodiment, a plurality of gas nozzles 21 are provided. The purpose of providing a plurality of gas nozzles is to enable the portions of a film which cover the alignment marks 4 in different positions on the wafer 1 to be removed at once, and the treatment time to be thereby reduced.

The gas nozzles 21 are so formed that they can be moved in the X-, Y- and Z-directions, i.e., in three-dimensional directions. The purpose of forming the gas nozzles in this manner is to enable the etching gas to be supplied to the alignment marks in any positions on the wafer 1.

The gas nozzles 21 are capable of supplying one of a plurality of different kinds of etching gases by regulating valves (changeover mechanisms) 21a.

In order to supply a plurality of different kinds of etching gases, a plurality of the gas nozzles 21 may be provided so that a predetermined kind of etching gas can be supplied from a predetermined gas nozzle 21.

The treatment chamber 17 is further provided therein with an etching terminal point detecting monitor (not shown) consisting, for example, of a mass analyzer so as to detect the etching terminal of the film covering the alignment mark 4.

The controlling of the alignment mark baring unit 10, for example, the controlling of the driving of the stage 18, the controlling of the temperature of the heating means 18a, the controlling of the driving of the beam irradiation means 19, the controlling of the laser beam 20 and the controlling of the etching gas are all carried out automatically by the main control unit 14 shown in FIG. 1.

The reduction projection exposure unit 11 in the alignment apparatus A of FIG. 1 is a mechanism for transferring a pattern formed on a reticle which will be described later onto a resist film 6 on the wafer 1, and consists, for example, of NSR1755i8A (number of openings NA=around 0.5–0.54) of Nikon Co., Ltd. as a base.

A principal portion of the reduction projection exposure unit 11 in this embodiment is shown in FIG. 3. A stage (alignment unit) 22 is formed so that it can be moved in the X- and Y-directions, i.e., in two-dimensional directions.

A wafer 1 which has finished being subjected to an alignment mark baring treatment is placed on the stage 22. Namely, in this embodiment, a wafer 1 on which the alignment mark 4 (refer to FIG. 5) is bared is placed.

A reduction lens 23 is provided above the stage 22. The reduction lens 23 is used mainly for imaging a pattern 24a, which is on a reticle 24 provided above the same lens, on the resist film 6 (refer to FIG. 5) on the wafer 1.

The reticle 24 is taken out from the reticle storage case 12 in accordance with an instruction made by the main control unit 14 before the reduction projection exposure of the alignment mark has been started, and it is set in the reduction projection exposure unit 11 so that it can be exposed.

A detecting unit 25 for use in detecting the position of the alignment mark 4 (refer to FIG. 5) is provided in the position diagonally above the left-hand portion of the reticle 24 of FIG. 3.

The mark position detecting unit 25 is adapted to apply alignment light to the alignment mark 4 on the wafer 1 through an opened pattern portion 24b on the reticle 24, detect the scattered light occurring due to the alignment light reflected on the alignment mark 4, convert the detected data into an electric signal and transfer the electric signal to the main control unit 14.

The main control unit 14 is adapted to calculate the position coordinates of the center of the alignment mark on the basis of the detected data transferred thereto, store the position coordinates on a predetermined file in the memory unit, and align the wafer 1 and reticle 24 with each other relatively by driving the stage 22 on the basis of the data on the coordinates of the center of the alignment mark 4.

In this embodiment, the light of a single wavelength, for example, a He-Ne laser beam (having a wavelength of 633 nm) is employed as alignment light. However, the alignment light is not limited to the light of a single wavelength, such as a He-Ne laser beam; it can be changed variously.

For example, light in which the wavelengths of the e-rays (having a wavelength of 546 nm) and d-rays (having a wavelength of 578 nm) from a mercury lamp are mixed may be used as alignment light.

For example, the light of a wide band of 50–100 nm may also be used as alignment light.

During an alignment operation, the light of a single wavelength, the light in which the wavelengths of e- and d-rays are mixed, or the light of a wide band may be used selectively in accordance with the condition of the alignment mark 4.

Since the techniques using the light in which the wavelengths of e- and d-rays are mixed and the light of a wide band as alignment light are described in detail in, for example, Japanese Patent Laid-Open No. 192113/1990, the description thereof is omitted in this part of the specification.

A power source (not shown) for an exposure operation is provided above the reticle 24. The exposure power source consists, for example, of a mercury lamp, and the exposure light, for example, i-rays (having a wavelength of 365 nm).

The unloader UL in the alignment apparatus A of FIG. 1 is a mechanism for carrying a wafer which has finished being subjected to a reduction projection exposure treatment to the outside of the apparatus A.

The wafer transfer systems 15a–15e are mechanisms for transferring the wafer 1, and it is set vacuous or has an inert gas atmosphere in view of the necessity of preventing the size variation, which occurs due to the oxidation of the resist film 6 (refer to FIG. 5) on the wafer 1, of a transferred pattern.

The reticle transfer system 13 is a mechanism for transferring the reticle 24 contained in the reticle storage case 12 to the reduction projection exposure unit 11.

The alignment method in the embodiment of the present invention will now be described with reference to FIGS. 1–21.

First, a wafer cassette (not shown) containing a plurality of wafers 1, an example of which is shown in FIGS. 4 and 5, is set on the loader L of FIG. 1.

In the loader L, the name of lot of the wafer cassette is read by means of a bar code reader (not shown), and the data thus obtained are transferred to the main control unit 14.

The main control unit 14 is adapted to send the wafers 1 sheet by sheet to the prealignment unit PA through the wafer transfer system 15b on the basis of a work instruction corresponding to the name of lot, and carry out the subsequent treatments automatically.

In the prealignment unit PA, the position of the wafer 1 is set on the basis of the orientation flat 1a of the wafer 1, and the position of the alignment mark 4 is determined with a not so high an accuracy, the data on this position being then transferred to the main control unit 14. The main control unit 14 stores the position data in the memory unit.

The wafer 1 which has finished being subjected to a prealignment step is then transferred to the alignment mark baring unit 10 through the wafer transfer system 15c.

The alignment mark baring unit 10 is adapted to remove the metal film 5 covering the alignment mark 4 on the wafer 1 and the resist film 6.

In this embodiment, the metal film 5 covering the alignment mark 4 and the resist film 6 are removed, for example, in the following manner.

Figure 14:
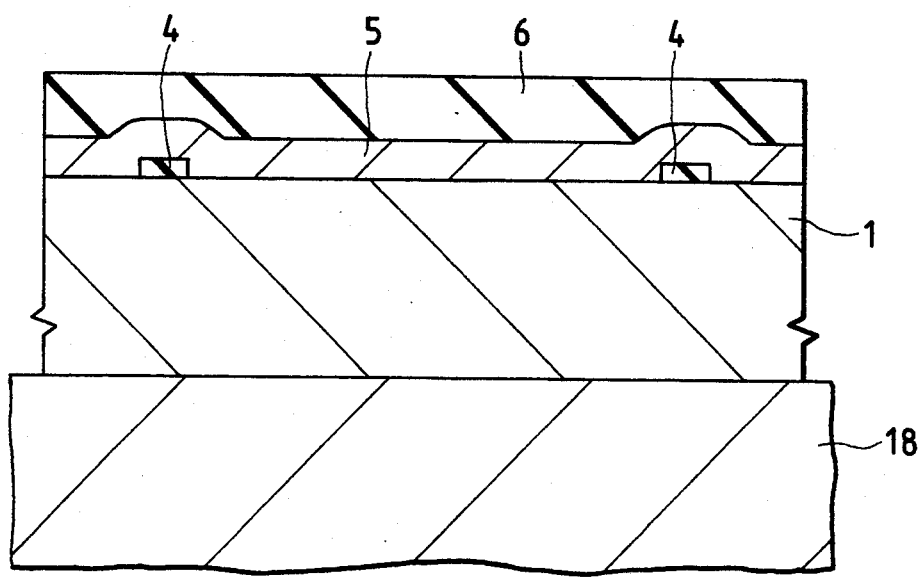
FIG. 14 is a sectional view of a principal portion of a substrate in an alignment mark baring step.

First, the wafer 1 is placed on the stage 18 in the alignment mark baring unti 10 (refer to FIG. 2) as shown in FIG. 14.

The main control unit 14 is then operated so as to increase the temperature of the heating means 18a in the stage 18 to a predetermined level and heat the wafer 1. This enables an etching reaction to be promoted when the film covering the alignment mark 4 is removed by etching, and this treatment time to be reduced.

Figure 15:
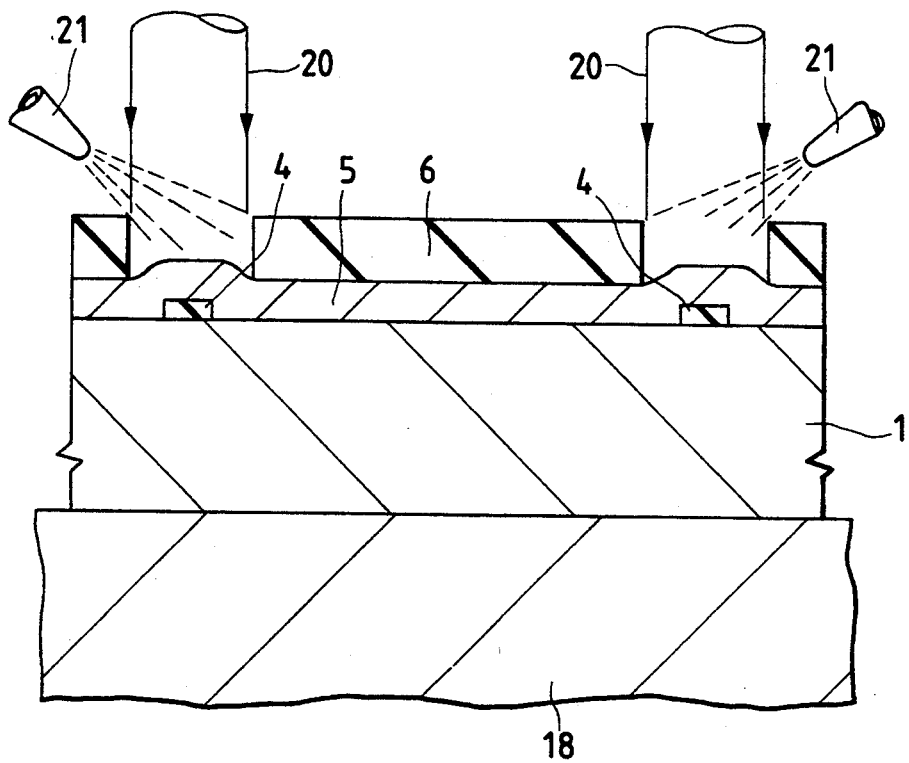
FIG. 15 is a sectional view of a principal portion of the substrate in a stage following the stage of FIG. 14 in the alignment mark baring step.

The laser beams 20 are then applied to the alignment marks 4 on the wafer 1 as shown in FIG. 15 as an etching gas, such as an ozone gas is ejected from gas nozzles 21 provided diagonally above the alignment marks 4 of the same drawing onto the positions to which the laser beams 20 are applied.

Thus, the predetermined portions of the resist film 6 which are on the alignment marks 4 are removed selectively by etching.

In this embodiment, the portions of the resist film 6 which cover alignment marks 4 in different positions can be removed at once by etching with the laser beams 20 applied to, for example, a plurality of positions simultaneously. This enables the treatment time to be reduced.

The setting of the position to which the laser beam 20 is to be applied is controlled automatically by the main control unit 14 on the basis of the data on the position of the alignment mark 4 the position of which has been determined in the above-mentioned prealignment step.

The etching terminal point is detected automatically by the main control unit 14 on the basis of, for example, the quantities of $CO_2$ and $H_2$ monitored by a mass analyzer (not shown) in the treatment chamber (refer to FIG. 2).

Figure 16:
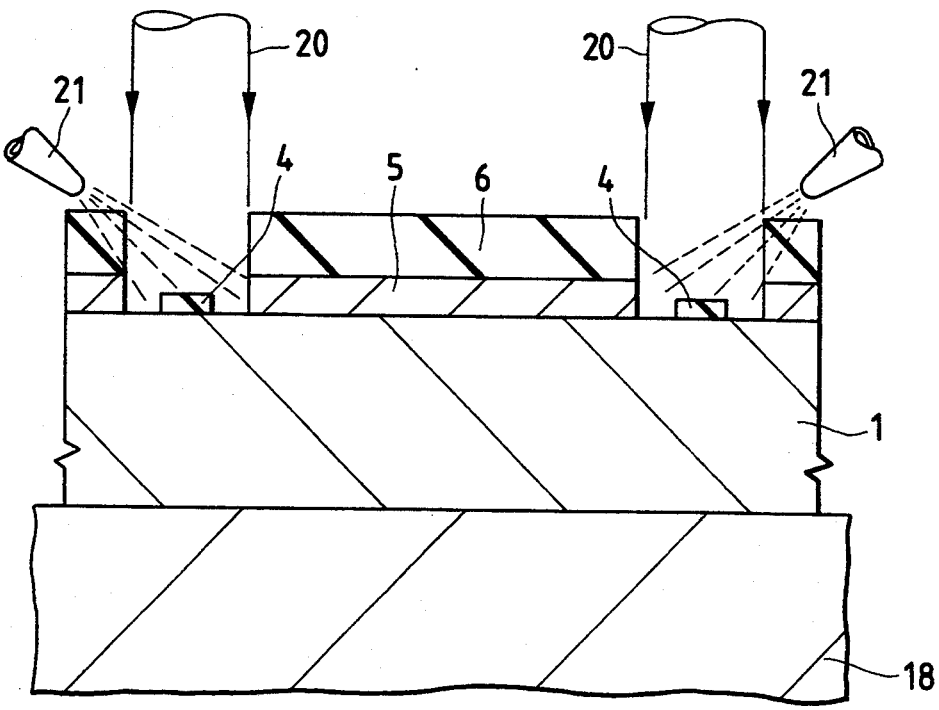
FIG. 16 is a sectional view of a principal portion of the substrate in a stage following the stage of FIG. 15 in the alignment mark baring step.

The portions of the resist film 6 which are above the alignment marks 4 are removed by etching as shown in FIG. 16, and the etching gas is then changed to, for example, a chlorine gas. The portions of the wiring metal film 5 which cover the alignment marks 4 are removed by etching with this chlorine gas.

Since the metal film 5 can be removed selectively by etching in this case as well, the alignment marks 4 are not damaged during this treatment, nor are they spoiled.

Namely, a decrease in the S/N ratio, which is ascribed to the damage to the surface of an alignment mark 4, can be prevented.

The etching terminal point in this case is determined automatically by the main control unit 14 on the basis of the quantity of $AlCl_3$ monitored by, for example, a mass analyzer (not shown) in the treatment chamber 17 (refer to FIG. 2).

The wafer 1 which has finished being subjected to an alignment mark baring treatment is sent to the reduction projection exposure unit 11 through the wafer transfer system 15d.

In the reduction projection exposure unit 11, the wafer 11 and reticle 24 are relatively aligned with each other, and an exposure treatment of the wafer is then carried out.

In this embodiment, for example, the enhanced global alignment system (refer to, for example, Japanese Patent Laid-Open No. 44429/1986 or 84516/1987) is employed as a system for detecting the position of the alignment mark 4.

The enhanced global alignment system is adapted to detect in advance the positions of the alignment marks 4 in a plurality of positions on the wafer 1, and determine the alignment position of the wafer 1 and reticle 24 by making statistic calculations on the basis of the detected position information on the alignment marks 4 in a plurality of positions.

Figure 17:
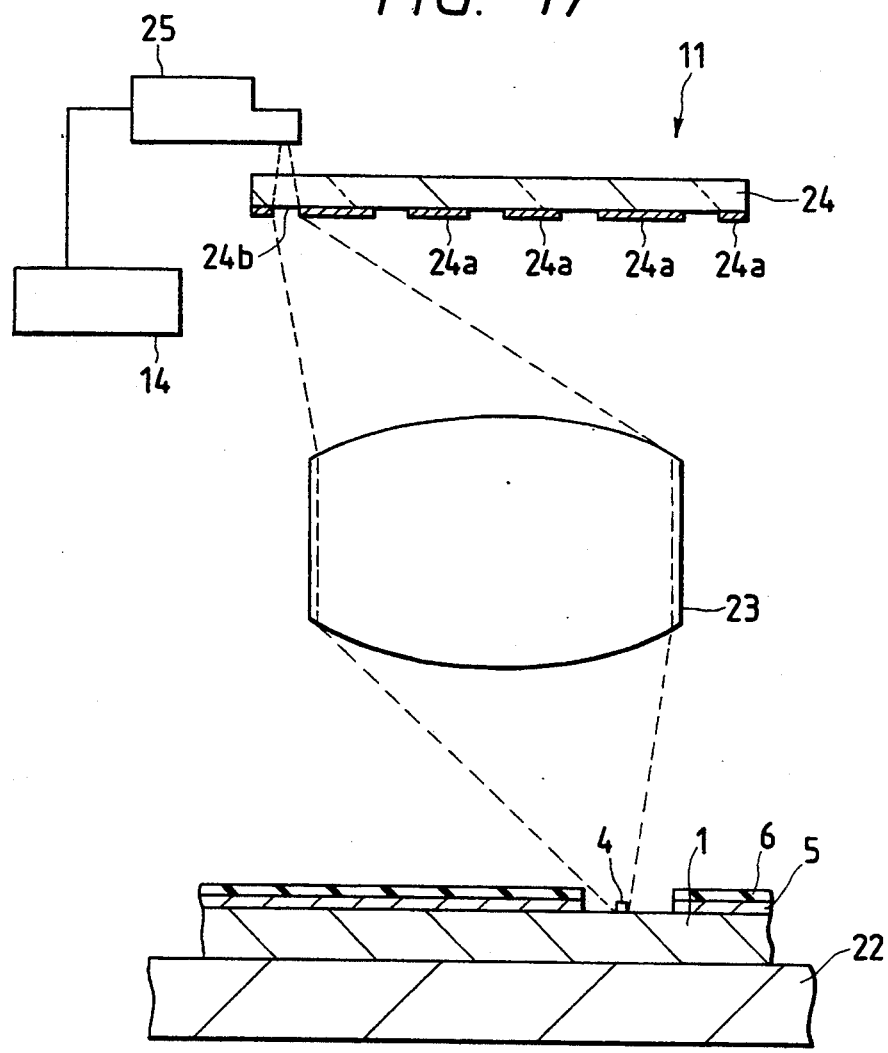
FIG. 17 is a sectional view of a principal portion of a substrate in an alignment step.

In this embodiment, the detecting of the position of the alignment mark 4 in each alignment mark region is done, for example, in the following manner. First, the wafer 1 is placed on the stage 22 in the reduction projection exposure unit 11 as shown in FIG. 17.

The mark position detecting unit 25 then applies alignment light to the alignment mark 4 on the wafer 1 through the opened pattern portion 24b and reduction lens 23.

In this embodiment, for example, a He-Ne laser beam is used as alignment light but the alignment light is not limited to this laser beam as mentioned above; it may be changed variously, and, for example, the light in which the wavelengths of e- and d-rays are mixed or wide-band light may be used.

During the alignment operation, the light of a single wavelength, and the light in which the wavelengths of e- and d-rays are mixed or wide-band light may be used selectively in accordance with the condition of the alignment mark 4.

The mark position detecting unit 25 is adapted to detect the scattered light of the alignment light emitted from the mark position detecting unit and reflected on the alignment mark 4, and convert the detected data into an electric signal, which is then transferred to the main control unit 14.

When the alignment light consists of light in which the wavelengths of e- and d-rays are mixed or wide-band light, a so-called bright visual field detecting system in which the light reflected on the surface of the alignment mark 4 is detected in the form of an image is employed.

In this embodiment, the alignment mark 4 is bared when the position of the alignment mark 4 is detected, and, accordingly, the alignment light can be applied directly to the alignment mark 4.

Therefore, a problem of occurrence of an error between the detected coordinates of the position of the center of the alignment mark 4 and the actual coordinates thereof, which is ascribed to the asymmetry of the opaque metal film 5 (refer to FIG. 5) covering the alignment mark 4, can be avoided. Consequently, the reliability of the coordinate value of the position of the center of the alignment mark 4 which is calculated in the alignment mark detecting step can be improved.

The deterioration of a detected signal of the alignment mark 4 which is ascribable to the unevenness of the formation of the resist film 6 can also be prevented.

Namely, in this embodiment, a decrease in the accuracy of detecting the position of the alignment mark 4 which is ascribable to the condition of the film covering the alignment mark 4 can be prevented, and the accuracy of detecting the position of the same mark 4.

Figure 18:
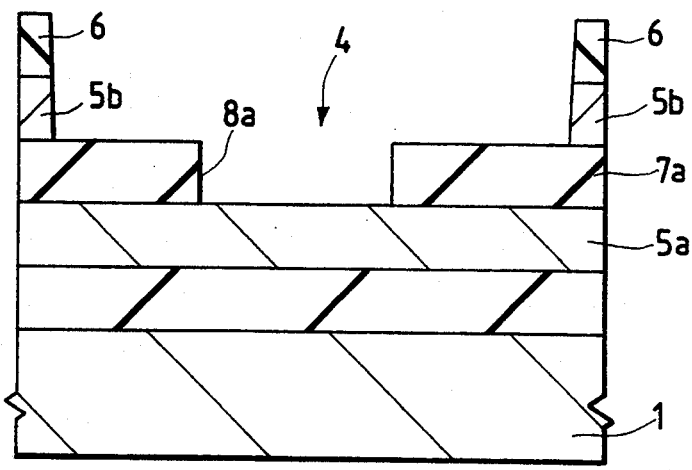
FIG. 18 is an enlarged sectional view of the alignment mark of FIG. 10 which has finished being subjected to the mark baring step.

FIG. 18 shows the condition of the alignment mark 4 of FIG. 10 in an alignment mark detecting step.

In this case, the alignment mark 4 also appears at the surfaces of the resist film 6 and opaque metal film 5b when the position of the alignment mark 4 is detected.

Therefore, in this case, the problem of occurrence of an error between the detected coordinates of the position of the center of the alignment mark 4 and the actual coordinates thereof, which is ascribed to the condition of the metal film 5b, and the problem of the deterioration of the detected signal of the alignment mark 4, which is ascribed to the condition of the resist film 6 can be avoided, and the accuracy of detecting the position of the alignment mark 4 can be improved.

Figure 19:
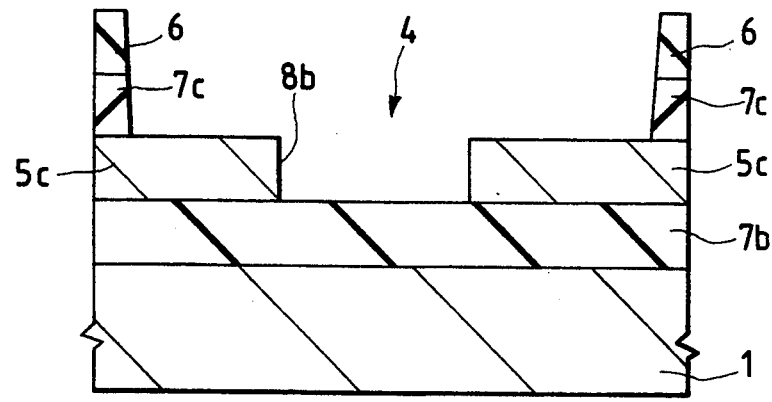
FIG. 19 is an enlarged sectional view of the alignment mark of FIG. 11 which has finished being subjected to the mark baring step.

FIG. 19 shows the condition of the alignment mark 4 of FIG. 11 in an alignment detecting step.

In this case, the alignment mark 4 appears at the surfaces of the resist film 6 and insulating film 7c.

Therefore, in this case, the problem of occurrence of an error between the detected coordinates of the position of the center of the alignment mark 4 and the actual coordinates thereof, which is ascribed to the asymmetry of the portion of the insulating film 7c which covers the alignment mark 4, and the problem of deterioration of the detected signal of the alignment mark 4, which is ascribed to the condition of the resist film 6 and insulating film 7c, can be avoided, and the accuracy of detecting the position of the alignment mark 4 can be improved.

Figure 20:
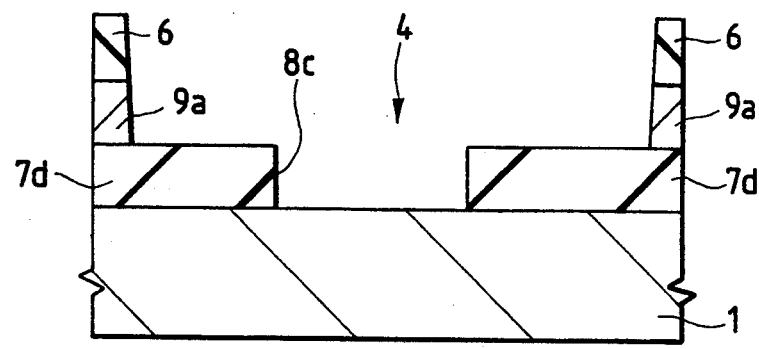
FIG. 20 is an enlarged sectional view of the alignment mark of FIG. 12 which has finished being subjected to the mark baring step.

FIG. 20 shows the condition of the alignment mark 4 of FIG. 12 in an alignment mark detecting step.

In this case, the alignment mark 4 appears at the surfaces of the resist film 6 and opaque conductor film 9a.

Therefore, in this case, the problem of occurrence of an error between the detected coordinates of the position of the center of the alignment mark 4 and the actual coordinates thereof, which is ascribed to the condition of the conductor film 9a, and the problem of the deterioration of the detected signal of the alignment mark 4, which is ascribed to the condition of the resist film 6, can be avoided, and the accuracy of detecting the position of the alignment mark 4 can be improved.

Figure 21:
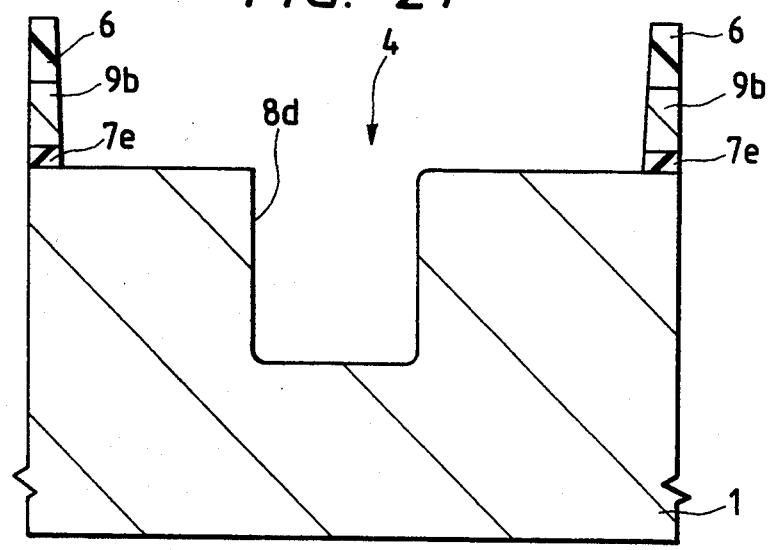
FIG. 21 is an enlarged sectional view of the alignment mark of FIG. 13 which has finished being subjected to the mark baring step.

FIG. 21 shows the condition of the alignment mark 4 of FIG. 13 in an alignment mark detecting step.

In this case the alignment mark 4 appears at the surfaces of the resist film 6, insulating film 7e and opaque conductor film 9b.

Therefore, in this case, the problem of occurrence of an error between the detected coordinates of the position of the center of the alignment mark 4 and the actual coordinates thereof, which is ascribed to the condition of the conductor film 9b, and the problem of the deterioration of the detected signal of the alignment mark 4, which is ascribed to the condition of the resist film 6 or insulating film 7e, can be avoided, and the accuracy of detecting the position of the alignment mark 4 can be improved.

The main control unit 14 is adapted to calculate the position coordinates of the center of the alignment mark 4 on the basis of highly accurate position data detected in an alignment mark detecting step, and relatively align the wafer 1 and reticle 24 with each other by driving the stage 21 on the basis of the data on the calculated position coordinates.

Accordingly, the accuracy of relatively aligning the wafer 1 and reticle 24 with each other can be improved to a level higher than that in a conventional alignment method.

In the reduction projection exposure unit 11, a regular reduction projection exposure treatment is carried out, and the pattern 24a on the reticle 24 is transferred to the resist film 6 on the wafer 1.

The wafer 1 is then sent to the unloader 13 through the wafer transfer system 15e, and taken out from the alignment apparatus A.

According to this embodiment described above, the following effects can be obtained.

(1) Prior to the step of detecting the position of the alignment mark 4 on the wafer 1 has been carried out, the portions of the metal film 5 and resist film 6 which cover the alignment mark 4 are removed so as to bare the alignment mark 4, whereby a decrease in the accuracy of detecting the position of the alignment mark 4, which is ascribed to the condition of the metal film 5 and resist film 6, can be prevented.

Namely, since the accuracy of detecting the position of the alignment mark 4 can be improved, the accuracy of relatively aligning the wafer 1 and reticle 24 with each other can be improved to a level higher than that in a conventional alignment method.

(2) The metal film 5 and resist film 6 which cover the alignment mark 4 can be removed selectively by subjecting these films to a gas assisted etching method using a laser beam 20.

Namely, since the metal film 5 and resist film 6 which cover the alignment mark 4 can be removed without damaging the surface of the alignment mark 4, an excellent detected signal having little noise can be obtained during the step of detecting the position of the alignment mark 4.

Therefore, the accuracy of detecting the position of the alignment mark 4 can be improved, and the accuracy of relatively aligning the wafer 1 and reticle 24 with each other can also be improved.

(3) Since the accuracy of the position in which a circuit pattern is formed can be improved owing to the effects mentioned in (1) and (2) above, it becomes possible to improve the yield and reliability of semiconductor integrated circuit devices.

(4) When the metal film 5 and resist film 6 which cover the alignment mark 4 are removed by etching, the wafer 1 is heated to a predetermined temperature, and this enables an etching reaction to be promoted, and the treatment time to be reduced.

(5) A plurality of beam irradiation means 19 and a plurality of gas nozzles 21 which constitute the mechanism for removing the metalic film 5 and resist film 6 which cover the alignment mark 4 are provided, and the portions of the metal film 5 and resist film 6 which cover different alignment marks 4, 4 are removed simultaneously by etching, whereby the treatment time can be reduced.

(6) Since a process from an alignment mark baring step to a mark aligning step is carried out consistently, the operation efficiency of this process can be improved.

Although the invention achieved by the inventor has been described concretely on the basis of its embodiments, it is not limited to the embodiments; it can, of course, be modified variously without departing from the gist of the invention.

For example, in the above embodiments, the process from the alignment mark baring step to the mark aligning step is carried out consistently but the present invention is not limited to the use of this process. For example, an alignment mark-bared portion alone may be treated independently.

In the above embodiments, a case where a series of steps, i.e. an alignment mark baring treatment, an alignment mark detecting treatment and exposure treatment are carried out in the mentioned order on the whole of one piece of wafer is described but the present invention is not limited to this process. For example, one piece of wafer is divided into predetermined regions, and an alignment mark baring treatment, an alignment mark detecting treatment and an exposure treatment may be carried out in each divisional region. Namely, a series of alignment mark baring, detecting and exposing steps may be carried out repeatedly on one piece of wafer.

While treating one piece of wafer, in the midst of an alignment mark baring treatment for one predetermined region, an alignment mark detecting or exposing treatment for another region may be carried out concurrently.

In the above embodiments, a case where a gas assisted etching method using an energy beam is used as an alignment mark-covering mark removing method is described but the present invention is not limited to this case. For example, a wet etching method may also be used.

Figure 22:
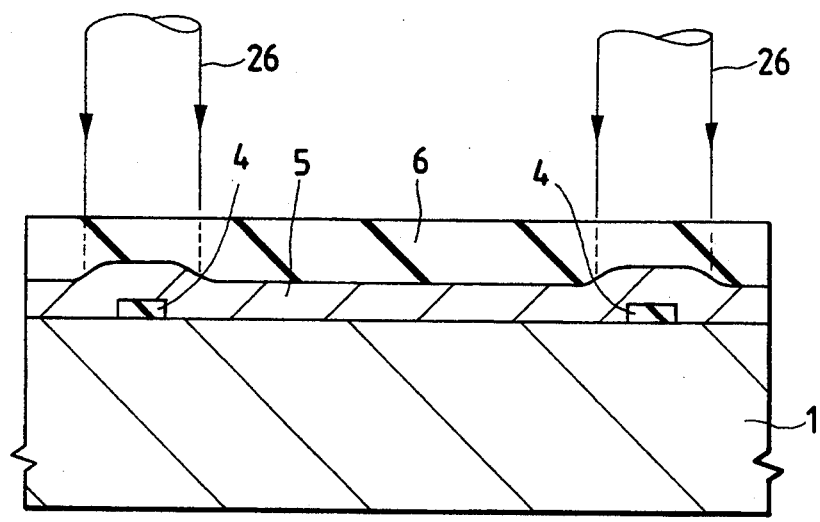
FIG. 22 is a sectional view of a principal portion of a substrate being subjected to an alignment mark baring step in the alignment method constituting another embodiment of the present invention.

In the case where a wet etching method is used, optical beams 26 set to a predetermined very small diameter are applied to the portions of the resist film 6 which correspond to the alignment mark 4, as shown in FIG. 22, so as to spot expose these portions of the resist film 6.

Figure 23:
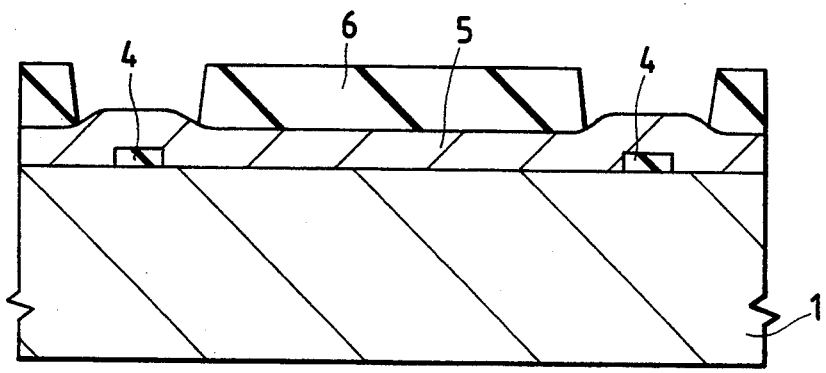
FIG. 23 is a sectional view of a principal portion of the substrate in a stage following the stage of FIG. 22 in the alignment mark baring step.

The wafer 1 is then developed so as to remove the exposed portions of the resist film 6 as shown in FIG. 23.

Figure 24:
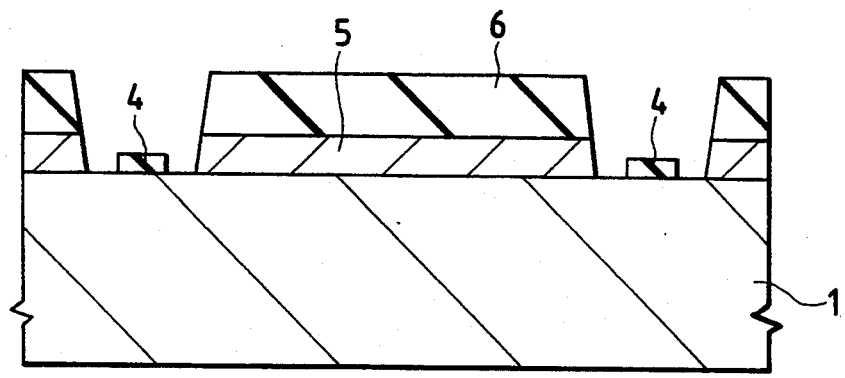
FIG. 24 is a sectional view of a principal portion of the substrate in a stage following the stage of FIG. 23 in the alignment mark baring step.
Figure 25:
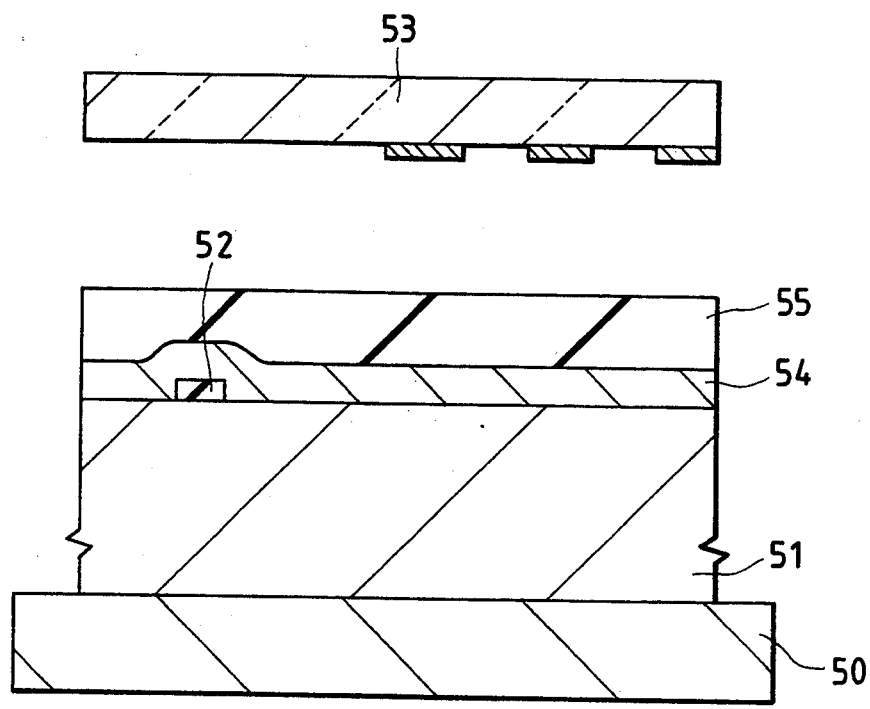
FIG. 25 is a partial sectional view of a wafer with a conventional alignment mark.
Figure 26:
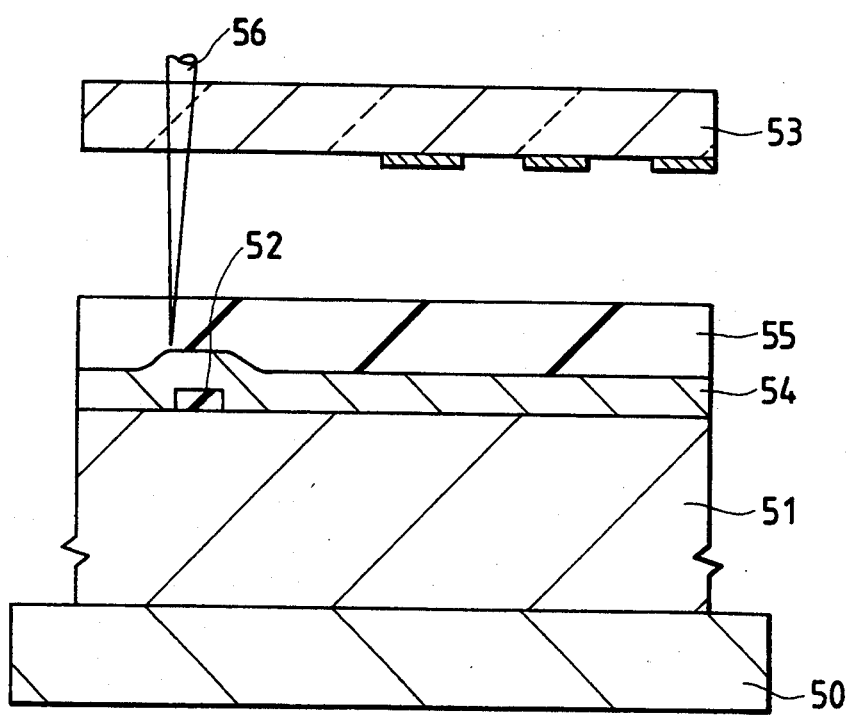
FIG. 26 is a partial sectional view of a wafer in a conventional alignment mark detecting step.
Figure 27:
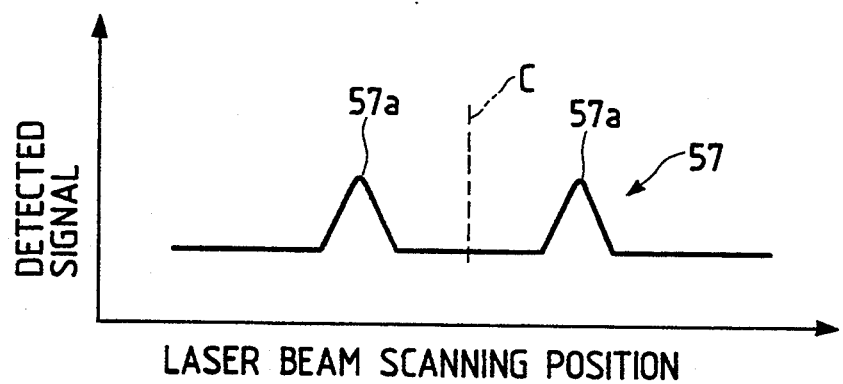
FIG. 27 is a graph showing a detected waveform of a conventional alignment mark.
Figure 28:
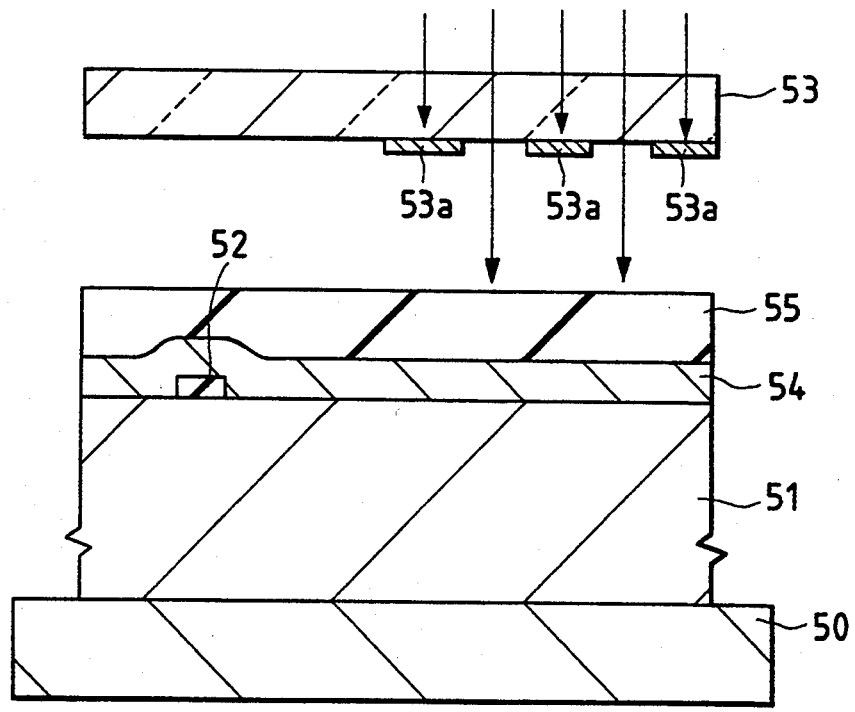
FIG. 28 is a partial sectional view of a wafer being subjected to a conventional baring step.
Figure 29:
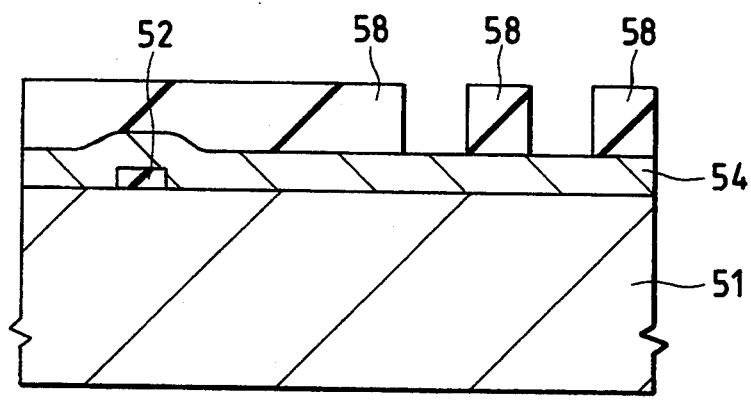
FIG. 29 is a partial sectional view of a wafer which has finished being subjected to a conventional developing method.
Figure 30:
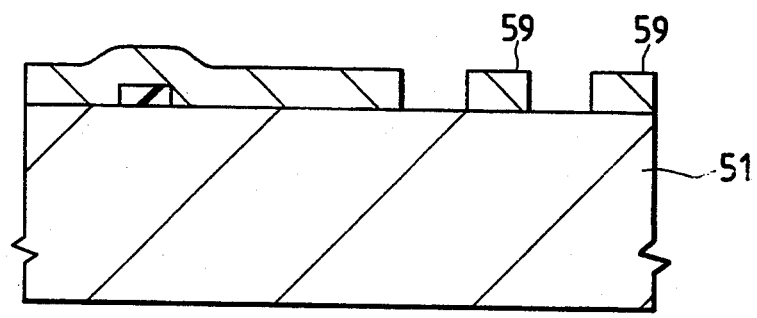
FIG. 30 is a partial sectional view of a wafer which has finished being subjected to a conventional pattern forming step using a resist pattern as a mark.
Figure 31:
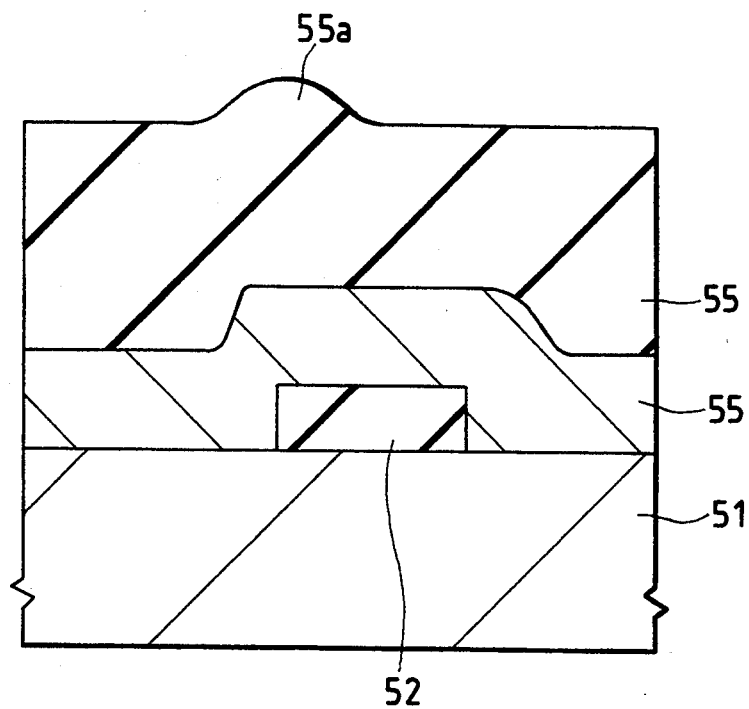
FIG. 31 is a partial enlarged section, which corresponds to FIG. 13, of a conventional wafer.
Figure 32:
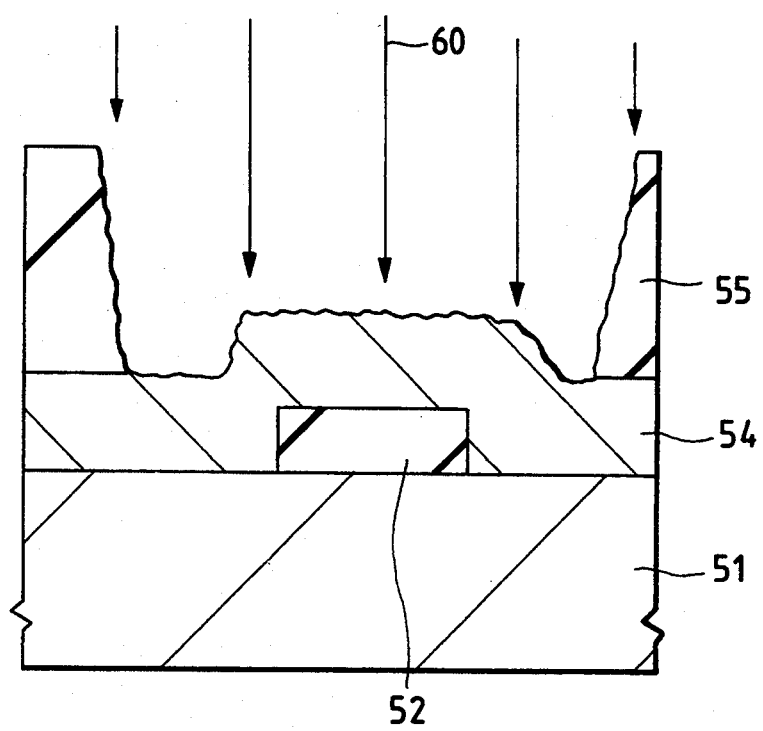
FIG. 32 is a partial sectional view of a wafer illustrating a conventional method of removing a resist film on an alignment mark.

The portion of the metal film 5 which expose at the surface of the resist film 6 are then removed by etching with, for example, heated phosphoric acid solution with the portions of the resist film 6 which are left on the wafer 1 used as masks, so as to bare the alignment marks 4 as shown in FIG. 24.

In the above embodiments, a case where gas assisted etching is used for removing a resist film and a film to be processed is described but the present invention is not limited to such a case. For example, the gas assisted etching can be used only when the resist film or a film to be processed is removed.

The above description is mainly about a case where the invention achieved by the inventor of the present invention is applied to the alignment techniques in the exposure step in the manufacture of semiconductor integrated circuit devices which constitutes the background art of the present invention and the field of industrial application thereof but the present invention is not limited to this case; it can be applied to various other cases.

The present invention can also be applied to, for example, a direct drawing method not using a mask and a reticle even in the same exposure step.

The present invention can also be applied to an alignment method used in an inspection operation, for example, an inspection operation for discovering extraneous matter on a wafer and an inspection operation for discovering a defect of a pattern.

Also, the present invention can be applied to the alignment techniques for forming a predetermined pattern on other kinds of substrates, for example, a mask (substrate), a printed wiring board (substrate) or a package board (substrate).

The effects obtained by a typical invention among the inventions disclosed in this specification will be simply described.

(1) According to the invention defined in claim 1, a decrease, which is ascribed to the condition of a predetermined film covering an alignment mark, in the accuracy of detecting the position of the alignment mark can be prevented.

Namely, since the accuracy of detecting the position of the alignment mark can be improved, the substrate aligning accuracy can be improved.

Accordingly, if the present invention is applied to, for example, an alignment method in an exposure step for the production of a semiconductor integrated circuit device, the accuracy of the position in which a circuit pattern is formed can be improved. This enables the yield and reliability of semiconductor integrated circuit devices to be improved.

(2) According to the invention defined in claim 2, the film covering an alignment mark can be selectively removed.

The film covering an alignment mark can be removed without damaging the surface of the alignment mark.

Therefore, in an operation for detecting the position of an alignment mark, an excellent detected signal having little noise can be obtained therefrom.

This enables the accuracy of detecting the position of an alignment mark to be improved, and the substrate aligning accuracy to be improved.

What is claimed is:

1. An alignment method for aligning a substrate having at least one alignment mark, said substrate having at least one film covering the at least one alignment mark, comprising the steps of:
   (a) locally removing the at least one film covering the at least one alignment mark so as to expose the at least one alignment mark;
   (b) detecting position coordinates of said at least one alignment mark on the substrate, the detecting being performed with the at least one alignment mark exposed, the locally removing being performed prior to the detecting; and
   (c) carrying out alignment of said substrate on the basis of said position coordinates.

2. An alignment method according to claim 1, wherein the locally removing is performed by a gas assisted etching method using an energy beam.

3. An alignment method according to claim 2, wherein said energy beam is a laser beam, an electron beam or an ion beam.

4. An alignment method according to claim 3, wherein said substrate is a semiconductor wafer.

5. An alignment method according to claim 1, wherein, in said step of detecting, an alignment light beam is applied directly to the at least one alignment mark.

6. An alignment method according to claim 5, wherein the alignment light beam is a laser beam.

7. An alignment method according to claim 1, wherein the at least one alignment mark is a projection formed on the substrate.

8. An alignment method according to claim 1, wherein the at least one alignment mark is a recess.

9. An alignment method according to claim 1, wherein said at least one film includes two films, an overlying film covering the at least one alignment mark and a photoresist film on the overlying film.

10. An alignment method according to claim 9, wherein said overlying film is a metal film.

11. An alignment method according to claim 1, wherein an alignment light beam is used for said detecting, and wherein the at least one film is opaque to the alignment light beam.

12. An alignment method according to claim 1, wherein the substrate has a plurality of alignment marks, with at least one film covering the plurality of alignment marks, and wherein, in the step of locally removing, the at least one film covering the plurality of alignment marks is simultaneously removed from the plurality of alignment marks so as to simultaneously expose the plurality of alignment marks.

13. An alignment method according to claim 1, wherein the step of locally removing is performed by etching, and the etching is monitored so as to detect an etching terminal point.

14. An alignment method according to claim 1, wherein the step of carrying out alignment is performed with an alignment light beam, inside a reduction exposure apparatus where a circuit pattern on a mask is to be transferred onto a photoresist film on the substrate by exposing the substrate to an exposure light beam.

15. An alignment method according to claim 14, wherein the wavelength of the exposure light beam is shorter than that of the alignment light beam.

16. An alignment method according to claim 15, wherein the alignment light beam is within a range of visible light.

17. An alignment method according to claim 16, wherein the at least one film covering the at least one alignment mark includes an overlying film covering the at least one alignment mark and a photoresist film covering the overlying film.

18. An alignment method according to claim 17, wherein the overlying film is an inorganic film made of a material selected from a group consisting of silicon oxide, polysilicon and aluminum.

19. An alignment method according to claim 17, wherein the overlying film is opaque to the alignment light beam.

20. An alignment method according to claim 17, wherein the overlying film is a metal film.

21. An alignment method according to claim 20, wherein the metal film is made of aluminum or an alloy of aluminum.

22. An alignment method according to claim 1, wherein the at least one film covering the at least one alignment mark includes an overlying film covering the alignment mark and a photoresist film covering the overlying film, and wherein the overlying film is removed by a gas assisted etching method using an energy beam.

23. An alignment method according to claim 22, wherein the energy beam is selected from a group consisting of a laser beam, an electron beam, and an ion beam.

24. A reduction exposure method for transferring a pattern on a mask onto a photoresist film on a major surface of a semiconductor wafer having at least one alignment mark on the semiconductor wafer, the at least one alignment mark being covered by at least two films including an overlying film, to be patterned, and the photoresist film, comprising the steps of:

(a) locally removing the photoresist film at a location over and around an alignment mark;

(b) locally removing the overlying film, to be patterned, at a location over and around the alignment mark;

(c) after steps (a) and (b), detecting a position of the alignment mark in an exposure apparatus by irradiating the alignment mark with an alignment light beam, while the alignment mark is exposed directly to the alignment light beam;

(d) in accordance with the result of detecting the position of the alignment mark, carrying out the alignment of the semiconductor wafer; and then (e) exposing the semiconductor wafer in an exposure apparatus to an exposure light beam shorter in wavelength than the alignment light beam, the semiconductor wafer being exposed through the mask so as to transfer the pattern on the mask onto the photoresist film on the major surface of the semiconductor wafer.

25. A reduction exposure method according to claim 24, wherein the alignment light beam is within the range of visible light.

26. A reduction exposure method according to claim 25, wherein the overlying film is an inorganic film of a material selected from a group consisting of silicon oxide, polysilicon and aluminum.

27. A reduction exposure method according to claim 24, wherein the overlying film is substantially opaque to the alignment light beam.

28. A reduction exposure method according to claim 27, wherein the overlying film is a metal film.

29. A reduction exposure method according to claim 28, wherein the metal film is made of aluminum or an alloy of aluminum.

30. A reduction exposure method according to claim 24, wherein the overlying film is removed by a gas assisted etching method using an energy beam.

31. A reduction exposure method according to claim 30, wherein the energy beam is selected from a group consisting of a laser beam, an electron beam and an ion beam.

* * * * *